(12) United States Patent
Kuzmenka

(10) Patent No.: US 12,074,080 B2
(45) Date of Patent: Aug. 27, 2024

(54) SELF-CLEANING HEATSINK FOR ELECTRONIC COMPONENTS

(71) Applicant: Micron Technology, Inc., Boise, ID (US)

(72) Inventor: Maksim Kuzmenka, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/107,968

(22) Filed: Feb. 9, 2023

(65) Prior Publication Data

US 2023/0187302 A1 Jun. 15, 2023

Related U.S. Application Data

(62) Division of application No. 16/791,370, filed on Feb. 14, 2020, now Pat. No. 11,581,236.

(51) Int. Cl.
*H01L 23/367* (2006.01)
*B21D 53/02* (2006.01)
*H01L 23/373* (2006.01)

(52) U.S. Cl.
CPC ...... *H01L 23/3672* (2013.01); *H01L 23/3675* (2013.01); *B21D 53/022* (2013.01); *F28F 2255/04* (2013.01); *H01L 23/3736* (2013.01)

(58) Field of Classification Search
CPC ............. H01L 23/3672; H01L 23/3675; F28D 2021/0029
USPC ...................................................... 165/80.3
See application file for complete search history.

(56) References Cited

U.S. PATENT DOCUMENTS

| 6,016,250 A | * | 1/2000 | Hanners | H01L 23/3735 |
| | | | | 174/16.3 |
| 6,330,157 B1 | * | 12/2001 | Bezama | H01L 23/473 |
| | | | | 361/689 |
| 9,401,317 B2 | * | 7/2016 | Tan | H01L 23/4093 |
| 2007/0169928 A1 | * | 7/2007 | Dayan | H01L 23/34 |
| | | | | 257/E23.099 |
| 2010/0225546 A1 | * | 9/2010 | Ogawa | H01Q 1/02 |
| | | | | 427/58 |
| 2017/0160021 A1 | | 6/2017 | Cognata et al. | |
| 2019/0010376 A1 | * | 1/2019 | Inoue | B82Y 40/00 |
| 2020/0355442 A1 | | 11/2020 | Lewis et al. | |
| 2021/0257271 A1 | | 8/2021 | Kuzmenka | |

FOREIGN PATENT DOCUMENTS

| CN | 2553348 Y | | 5/2003 |
| CN | 101526840 A | * | 9/2009 |
| CN | 101803011 B | | 6/2012 |
| CN | 107166344 A | | 9/2017 |

(Continued)

*Primary Examiner* — Jon T. Schermerhorn, Jr.
(74) *Attorney, Agent, or Firm* — Perkins Coie LLP

(57) ABSTRACT

Systems for cooling semiconductor devices that can comprise a heatsink and a cleaning element for the heatsink. The heatsink can have fins spaced apart from each other by channels. The cleaning element can have a base and one or more arms extending from the base. The cleaning element can be positioned with respect to the heatsink such that each arm is aligned with a corresponding channel between the fins, and the arms are moveable between a flow configuration in which the arms are in the channels and a cleaning configuration in which the arms are outside of the channels.

13 Claims, 7 Drawing Sheets

(56) References Cited

FOREIGN PATENT DOCUMENTS

| | | | | |
|---|---|---|---|---|
| CN | 207615231 U | * | 7/2018 | |
| CN | 108430919 A | | 8/2018 | |
| CN | 208273469 U | | 12/2018 | |
| CN | 109443077 A | | 3/2019 | |
| CN | 209423190 U | * | 9/2019 | |
| CN | 209423190 U | | 9/2019 | |
| CN | 210516384 U | * | 5/2020 | |
| CN | 210664119 U | * | 6/2020 | |
| CN | 210725832 U | | 6/2020 | |
| JP | S61237972 A | * | 10/1986 | |
| JP | S61237972 A | | 10/1986 | |
| JP | S635691 A | | 1/1988 | |
| JP | H06123276 A | | 5/1994 | |
| JP | 2005098241 A | | 4/2005 | |
| JP | 2012012064 A | | 1/2012 | |
| JP | 2013021121 A | | 1/2013 | |
| JP | 2013021121 A | * | 1/2013 | |
| JP | 2015179687 A | | 10/2015 | |
| JP | 2015179687 A | * | 10/2015 | |
| JP | 2016104470 A | | 6/2016 | |

* cited by examiner

SELF-CLEANING HEATSINK FOR ELECTRONIC COMPONENTS

CROSS-REFERENCE TO RELATED APPLICATION(S)

This application is a division of U.S. patent application Ser. No. 16/791,370, filed Feb. 14, 2020, which is incorporated herein by reference in its entirety.

TECHNICAL FIELD

The present technology relates to cooling electronic devices, and more particularly to systems for cleaning heatsinks in microelectronic devices.

BACKGROUND

High performance semiconductor devices, such as central processing units, graphics processors, memory devices, high-power transistors, lasers and light emitting diodes, often generate a significant amount of heat. If the temperature of a component is too high, the heat can impair the speed, capacity, output, life span, or other performance parameter and even lead to failure. High performance semiconductor devices often include a heatsink thermally coupled to the component to dissipate the heat to a fluid medium, such as air.

Heatsinks are designed to maximize the surface area in contact with the fluid medium. Conventional heatsinks are generally formed form a thermally conductive metal, such as copper, aluminum, or aluminum alloys, and they include a plate connected to the electronic component and fins that extend away from the plate. The fins are generally planar panels or pins. During operation, heat from the component flows through the plate to the fins, and the fluid medium removes the heat from the system as the fluid medium passes through the fins.

A common challenge for electronic systems is that dust and other particulates accumulate on the fins over time. For example, many electronic systems include fans that direct an airflow through the spaces between the fins of the heatsink and dust and other particulates in the airflow tend to accumulate on the surfaces of the fins. This can eventually form a deposit with low thermal conductivity on and/or between the fins that reduces the heat transfer rate from the fins to the air flow. Over time, the components can overheat, which can impair the performance of the devices and lead to failure.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. Moreover, in the drawings, like reference numerals designate corresponding parts throughout the several views and/or embodiments.

DETAILED DESCRIPTION

Specific details of several embodiments of self-cleaning heatsinks for electronic components, and associated systems and methods, are described below with reference to FIGS. 1-9B. In several of the embodiments, a semiconductor device assembly includes a semiconductor device and a heatsink configured to conduct thermal energy away from the semiconductor device. The heatsink includes a plate in thermal communication with the semiconductor device and fins that extend away from plate. The fins are separated from each other by channels through which air can flow. The semiconductor device assembly further includes cleaning elements configured to move through at least a portion of the channels to remove accumulated particulates and thereby clean the heatsink. The cleaning elements can include a shape-memory alloy configured to change shape when the temperature exceeds a threshold temperature so that the arms can perform a cleaning cycle.

Figure 1:
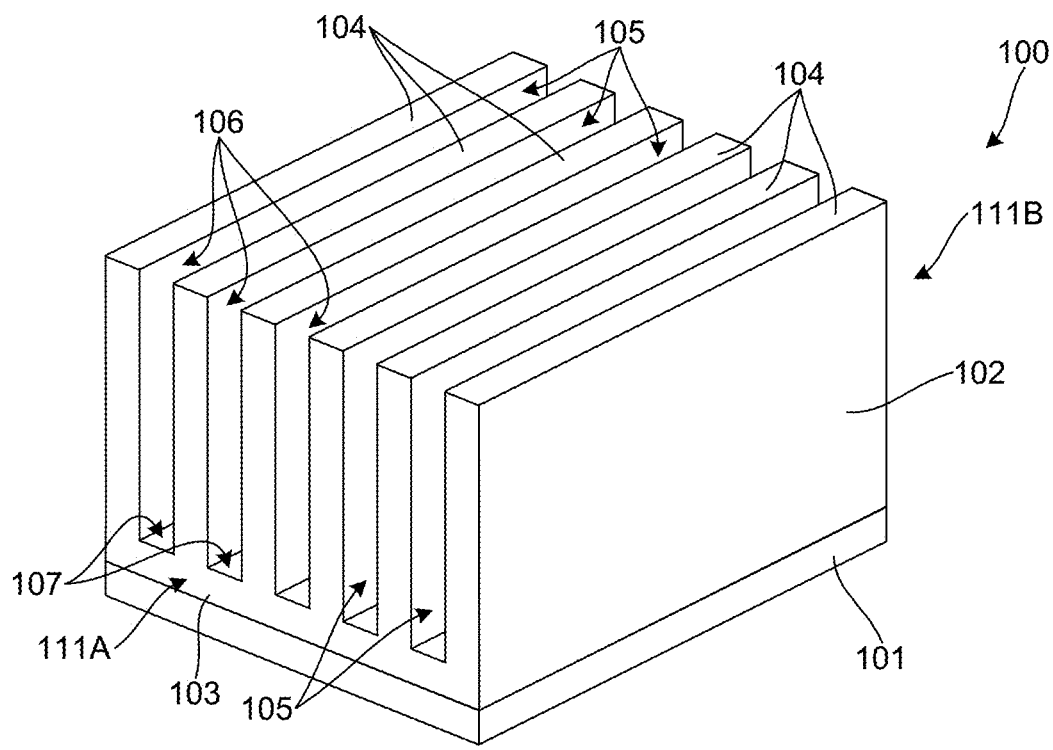
FIG. 1 is an isometric view of a heatsink for an electronic device.

FIG. 1 is an isometric view of a system 100 that includes a semiconductor device 101 and a finned heatsink 102 coupled to the semiconductor device 101. The system 100 does not show a cleaning element with the heatsink 102, but it will be appreciated that the system 100 can be used with any of the cleaning elements described below with respect to FIGS. 3-9B. The semiconductor device 101 can be a processor, memory device, diode (e.g., light emitting diode), or other type of microelectronic semiconductor assembly with one or more semiconductor dies. The heatsink 102 includes a plate 103 and fins 104 that project from the plate 103. The fins 104 can be generally rectilinear (e.g., rectangular or square) and have sidewalls 106. The fins 104 extend between first and second ends 111A and 111B, respectively, of the heatsink 102 such that the fins 104 are generally parallel to each other and spaced apart from each other by channels 105. The fins 104 can extend the full length or only a portion of the distance between the first and second ends 111A and 111B. Each channel 105 is bounded by the sidewalls 106 of adjacent fins 104 and by a floor portion 107 defined by a portion of the top surface portion of the plate 103. In the illustrated embodiment, the heatsink 102 includes six fins 104 and five channels 105, but the heatsink 102 can include any suitable number of fins 104 and channels 105.

The heatsink 102 is formed from a thermally conductive material. For example, the heatsink 102 can be formed from copper, aluminum metal, an aluminum alloy, or other suitably thermally conductive metals. The heatsink 102 is in thermal communication with the semiconductor device 101, such as being attached to a surface of the device 101 or a packaging material housing the semiconductor device 101. For example, the plate 103 can be close to the semiconductor device 101, and in many applications the plate 103 is attached to a surface of the semiconductor device 101 using a thermal interface material that has a high thermal conductivity. The thermal interface material can also have good surface coverage to fill small spaces between the plate 103 and the semiconductor device 101. The thermal interface material can be a thermal paste and/or thermal tape applied to the plate 103 and/or the semiconductor device 101. In other embodiments, the plate 103 can be attached to the semiconductor device 101 with clips, spacers, and/or push pins instead of, or in addition to, the thermal paste or thermal tape. The heat generated by the device 101 accordingly flows through the plate 103 and then to the fins 104.

Figure 2:
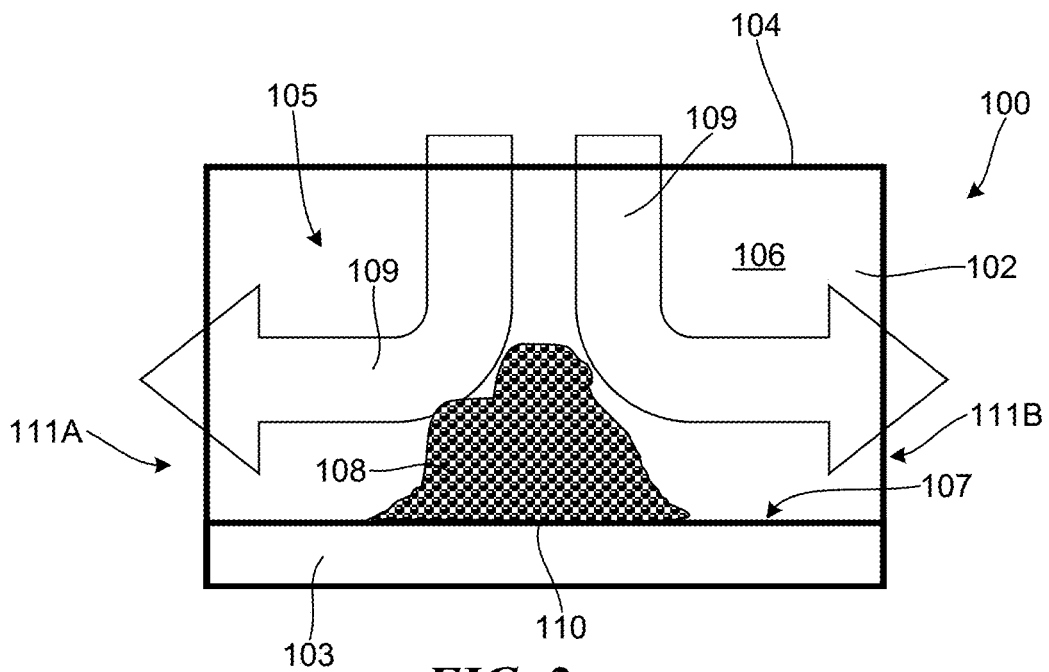
FIG. 2 is a diagram of a heatsink with an accumulation of contaminants within channels of the heatsink.

FIG. 2 shows a typical operation of the heatsink 102 without a cleaning element. More specifically, an airflow 109 through the channels 105 draws heat from the fins 104 to cool the system. Although the airflow 109 improves the heat transfer rate, the airflow 109 can also carry contaminants 108, such as dust or other particulates, that can accumulate and form a deposit 110 in the channels 105. Over time, for example, the contaminants 108 can accumulate on the sidewalls 106 and/or floor portions 107 of the channel 105 to form the deposit 110. The deposit 110 prevents the airflow 109 from contacting the covered surfaces of the heatsink 102 and insulates the covered areas because the deposit has a lower thermal conductivity than the material of the heatsink 102. This can cause the heat transfer rate of the heatsink 102 to decrease to a point that it does not adequately cool the semiconductor device 101.

Figure 3:
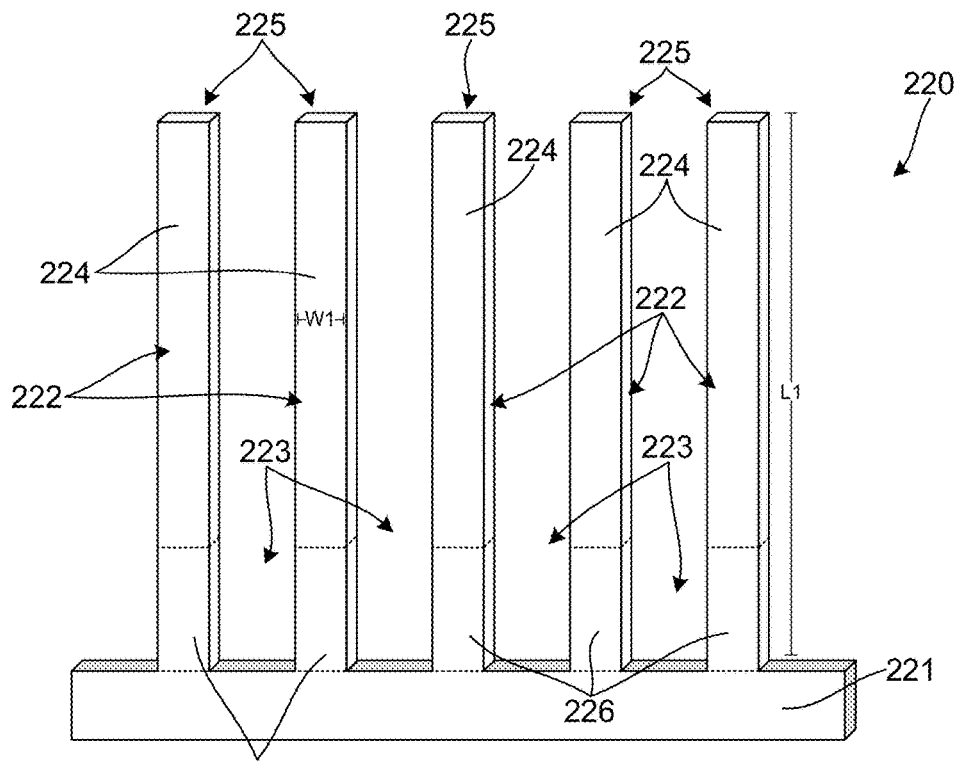
FIG. 3 is an isometric view of a cleaning element in accordance with the present technology for use with a heatsink.

FIG. 3 shows an isometric view of a cleaning element 220 for use with a heatsink and a semiconductor device, such as the heatsink 102 and the semiconductor device 101 described above with reference to FIGS. 1 and 2. In some embodiments, each cleaning element 220 includes a base 221 and arms 222 projecting from the base 221 that are separated from each other by gaps 223. Each arm 222 includes a capture portion 224 and a flex portion 226. The flex portions 226 can extend from the base 221, and the capture portions 224 can extend from the flex portions 226 to a terminus 225.

Figure 4:
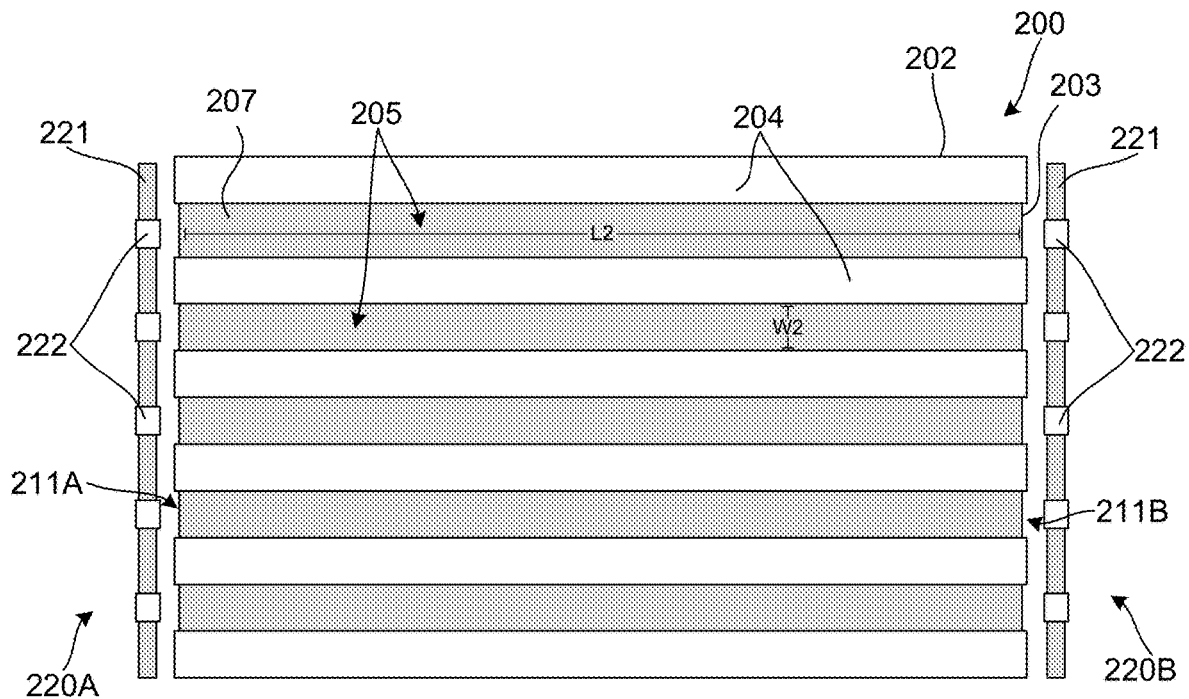
FIG. 4 is a top plan view of two of the cleaning elements of FIG. 3 at opposing ends of a heatsink in accordance with the present technology.

FIG. 4 shows a top plan view of a system 200 that includes a heatsink 202 having first and second ends 211A and 211B, a first cleaning element 220A at the first end 211A, and a second cleaning element 220B at the second end 211B. The heatsink 202 includes a plate 203 and fins 204 spaced apart from each other by channels 205 similar to the heatsink 102 described above. Each cleaning element 220A, 220B can be similar to the cleaning element 220 described above with respect to FIG. 3. The cleaning elements 220A and 220B are positioned with respect to the heatsink 202 such that each arm 222 is aligned with corresponding one of the channels 205. Each of the arms 222 can have a first width W1 (FIG. 3) and a first length L1 (FIG. 3), and each channel 205 can have a second width W2 and a second length L2. In representative embodiments, the first width W1 can be less than the second width W2 such that (a) the arms 222 do not impair the flow of air through the channels in the orientation shown in FIG. 3, and (b) at least a portion of the arms 222 can move through the channels 205. In some embodiments, the second length L2 of the channels 205 can be at least twice as long as the first length L1 of the arms 222 so that the arms 222 of both cleaning elements 220A and 220B can move into the channels 205 without overlapping each other.

Figure 5A:
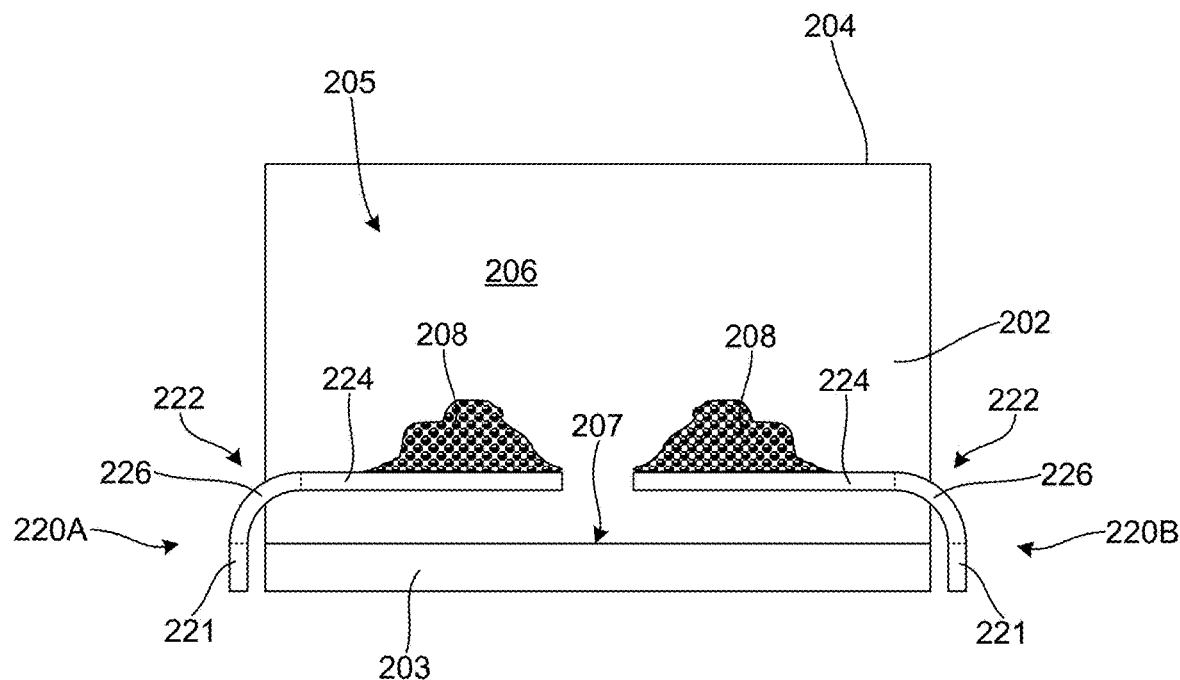
FIG. 5A is a side elevation view showing cleaning elements in an flow configuration in accordance with the present technology.
Figure 5B:
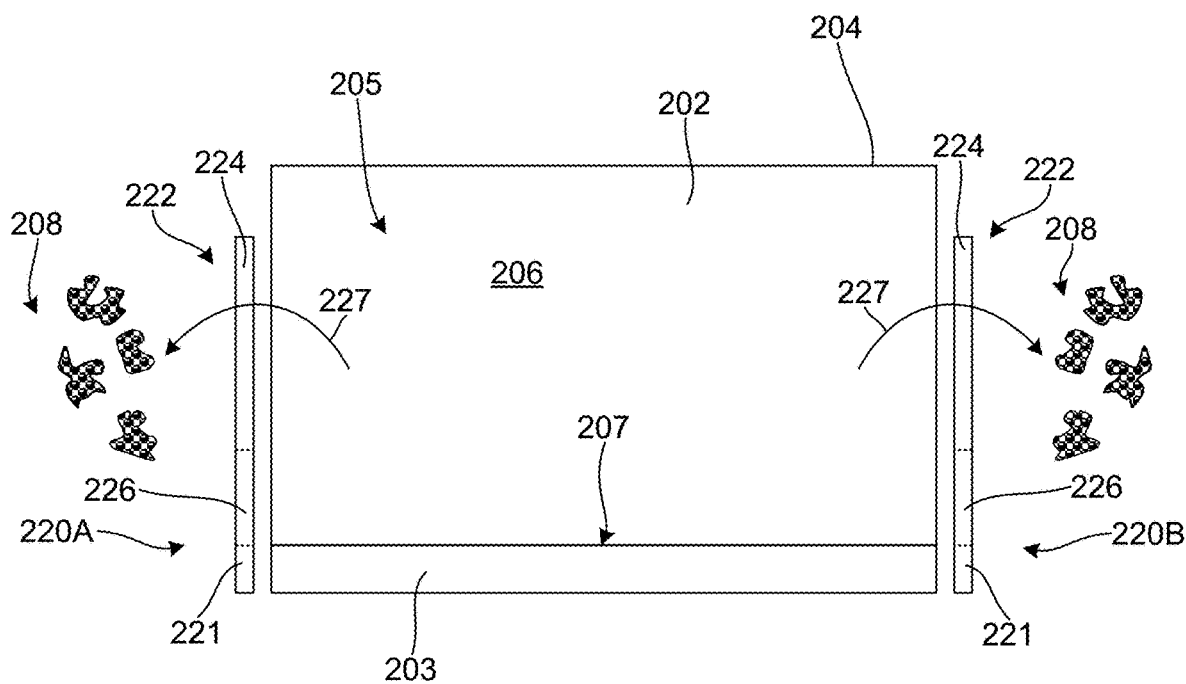
FIG. 5B is a side elevation view showing the cleaning elements in a cleaning configuration in accordance with the present technology.

FIGS. 5A and 5B are side elevation views showing the cleaning elements 220A and 220B moving from a flow configuration (FIG. 5A) to a cleaning configuration (FIG. 5B) for removing contaminants 208 from the channels 205. When the cleaning elements 220A and 220B are in the flow configuration, the flex portions 226 of the arms 222 are flexed/bent such that the capture portions 224 of the arms 222 are in the channels 205 and extend over at least part of the floor portions 207. The capture portions 224 of the arms 222 are accordingly transverse to the base 221 in the flow configuration (e.g., a non-zero angle such as 90°). As a result, contaminants 208 can accumulate on the capture portions 224 of the arms 222 instead of on the floor portions 207. Referring to FIG. 5B, when the cleaning elements 220A and 220B move from the flow configuration to the cleaning configuration, the flex portions 226 of the arms 222 can straighten such that the capture portions 224 move (e.g., rotate outwardly as shown by arrows 227) out of the channels 205. The capture portions 224 of the arms 222 can accordingly drive the contaminants 208 out of the channels 205 and thereby clean the heatsink 202. The flex portions 226 can flex more or less than shown in FIG. 5B.

In some embodiments, the arms, or at least the flex portions 226 of the arms 222, are a shape-memory material (e.g., a nickel-titanium alloy) that changes shape in response to a change in temperature. For example, the arms 222 can be formed from a shape-memory alloy that assumes one of two configurations depending on the temperature. Shape-memory alloys have two different phases and can reversibly move between the two phases by heating and/or cooling the alloy. Shape-memory alloys suitable for the arms 222 have a two-way shape-memory effect that can have a first shape when heated above a first threshold temperature or a second shape when cooled below a second threshold temperature. By forming the arms 222, or at least the flex portions 226, from a shape-memory alloy having a two-way memory effect, the cleaning elements 220A and 220B can be configured to periodically move between the flow configuration and the cleaning configuration as the temperature of the cleaning elements 220 fluctuates during the regular operation of an electronic device.

In some embodiments, the cleaning elements 220 can be configured to complete a cleaning cycle by (a) moving from the cleaning configuration to the flow configuration when the device turns on, and (b) moving back to the cleaning configuration when the device turns off. During operation, heatsinks within conventional electronic devices (e.g., personal computers) regularly experience temperatures greater than 50° C. Accordingly, in some embodiments, the arms 222 can be formed from a two-way shape-memory alloy having a threshold temperature of approximately 45-50° C., and in some cases 50° C. When the electronics have been turned off for a period, the heatsink 202 is typically at room temperature and air flowing through the heatsink 202 is minimal. At this point, the cleaning elements 220 can be in the cleaning configuration (e.g., FIG. 5B). After the electronics are turned on, the heatsink 202 warms and fans within the device activate to increase airflow through the heatsink 202. When the temperature exceeds the threshold temperature (e.g., 45-50° C.), the cleaning elements 220 can move to the flow configuration as the shape-memory alloy changes shape causing the flex portions 226 flex/bend. While the temperature remains at or above 45-50° C., the cleaning elements 220 remain in the flow configuration and contaminants 208 can adhere to the capture portions 224 of the arms 222. However, when the device turns off and the temperature cools below 50° C., the flex portions 226 of the arms 222 at least partially straighten and move the capture portions 224 out of the channels 205. This returns the cleaning elements 220A and 220B to the cleaning configuration and thereby removes the contaminants 208 from the channels 205.

In the previously described embodiments, the threshold temperature of the shape-memory alloy is 45-50° C., and in particular 50° C. In other embodiments, however, the cleaning elements 220 can be formed from a shape-memory alloy having a different threshold temperature. For example, in some embodiments, the threshold temperature can be 40° C., 40° C.-50° C., or greater than 50° C. In general, the threshold temperature of the shape-memory alloy can be any suitable temperature for the operating range of the device. Further, in some embodiments, the shape-memory alloy can have two different threshold temperatures such that the cleaning elements 220 move from the cleaning configuration to the flow configuration at a first threshold temperature (e.g., 50° C. or above) and from the flow configuration to the cleaning configuration at a second temperature that is different from the first configuration (e.g., 40° C. or below).

The contaminants 208 generally accumulate slowly such that it may take several weeks or even months for the contaminants to impact performance. In these applications the cleaning elements 220 may need to perform a cleaning cycle only when the device turns on and off. However, some electronic devices are often operated continuously for extended periods of time and/or are located in a dusty environment that leads to an increased dust accumulation rate. Accordingly, in some embodiments, the cleaning elements 220 can be configured to complete one or more cleaning cycles after turning the device on and after turning the device off. For example, during operation of the device, the temperature fluctuates within the device as the power load varies. If the power load decreases enough, the temperature of the heatsink can fall below the threshold temperature and the cleaning elements 220 can move to the cleaning configuration. If the power load increases such that the temperature exceeds the threshold temperature, the cleaning elements 220 can move back to the flow configuration. Additionally, in some embodiments, the electronic device can be programmed to reduce the power load periodically and thereby reduce the temperature in the device to cause the cleaning elements 220 to perform a cleaning cycle. For example, if the device determines that the temperature has been above the threshold temperature for an extended period of time, and therefore that the cleaning elements 220 have not performed a cleaning cycle for a while, the device can be programmed to reduce the power consumption so that the cleaning elements 220 perform a cleaning cycle. In some embodiments, the device can be configured to alert a user when the device temporarily reduces power consumption to induce a cleaning cycle.

In still another embodiment, the cleaning elements 220 can be in the flow configuration below a threshold temperature and the cleaning configuration above a threshold temperature. For example, if the normal operating temperature of a semiconductor device is 50-65° C. and performance is impaired at temperatures above 65° C., then the cleaning elements 220 can remain in the flow configuration shown in FIG. 5A below a threshold temperature greater than 65° C. and move to the cleaning configuration when the temperature of the device exceeds 65° C. In this way, the cleaning elements 220 remove contaminants from the channels 205 when overheating occurs, or is about to occur, and then the cleaning elements 220 return to the flow configuration after the temperature drops to within the normal operating range.

Figure 6:
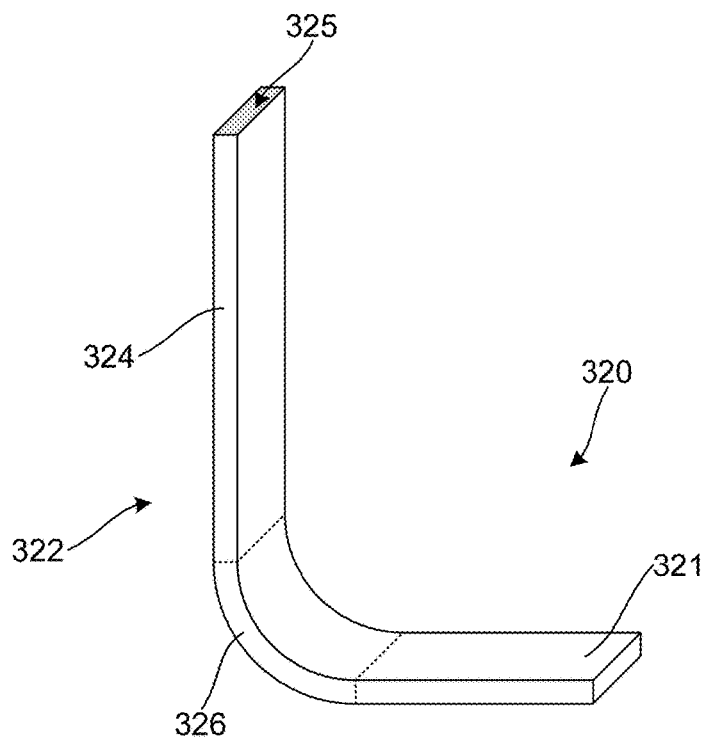
FIG. 6 is an isometric view of a cleaning element in accordance with the present technology for use with a heatsink.

In the previously described embodiments, the cleaning elements 220 include a plurality of arms 224 extending from a common base 221 positioned outside of the heatsink 202. In other embodiments, however, a cleaning element can be an individual arm that is attached to the heatsink itself. FIG. 6 shows an isometric view of a cleaning element 320 having a base 321 and a single arm 322 extending from the base 321. The arm 322 can include a capture portion 324 and a flex portion 326 between the capture portion 324 and the base 321. The cleaning element 320 can be formed from a two-way shape-memory alloy that can change shape when the temperature crosses a threshold temperature. In this way, when the cleaning element 320 is heated above the temperature threshold, the flex portion 326 can change shape such that the cleaning element 320 moves from the cleaning configuration to the flow configuration. When the cleaning element 320 later cools below the threshold temperature, the flex portion 326 can change back to its original shape such that the cleaning element 320 moves from the flow configuration to the cleaning configuration.

Figure 7:
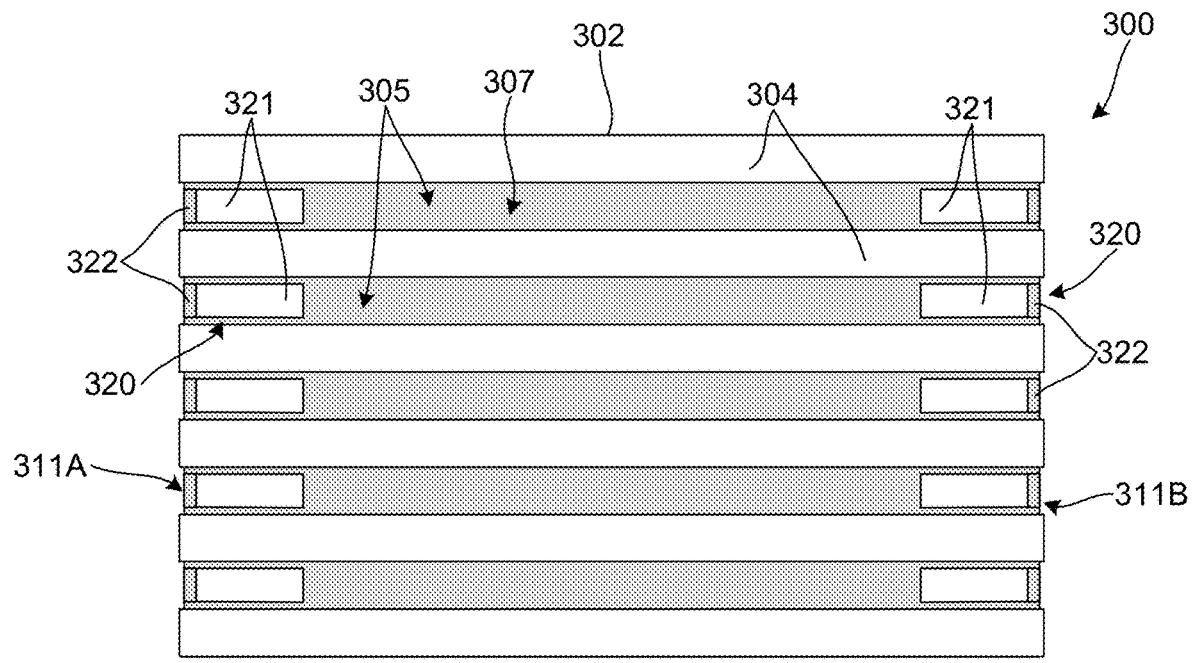
FIG. 7 is a top plan view of a plurality of the cleaning elements of FIG. 6 at opposing ends of a heatsink in accordance with the present technology.

FIG. 7 shows a top plan view of a system 300 that includes a plurality of cleaning elements 320. The cleaning elements 320 are positioned adjacent to opposing ends 311A and 311B of a heatsink 302, and individual cleaning elements 320 are positioned in one of the corresponding channels 305 such that the bases 321 are coupled to floor portions 307 in the channels 305.

Figure 8A:
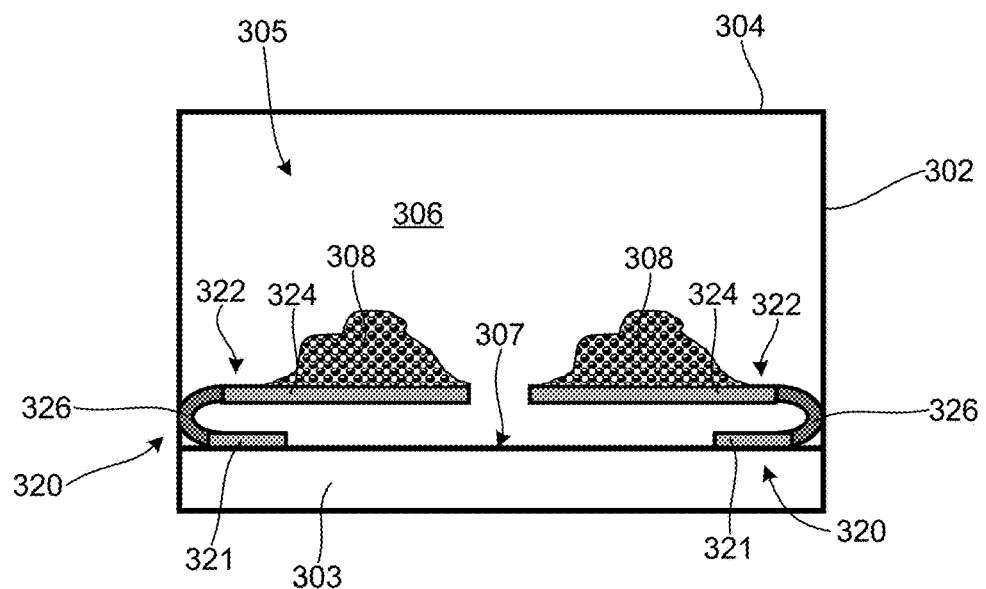
FIG. 8A is a side elevation view of the cleaning elements shown in FIG. 6 in a flow configuration in accordance with the present technology.
Figure 8B:
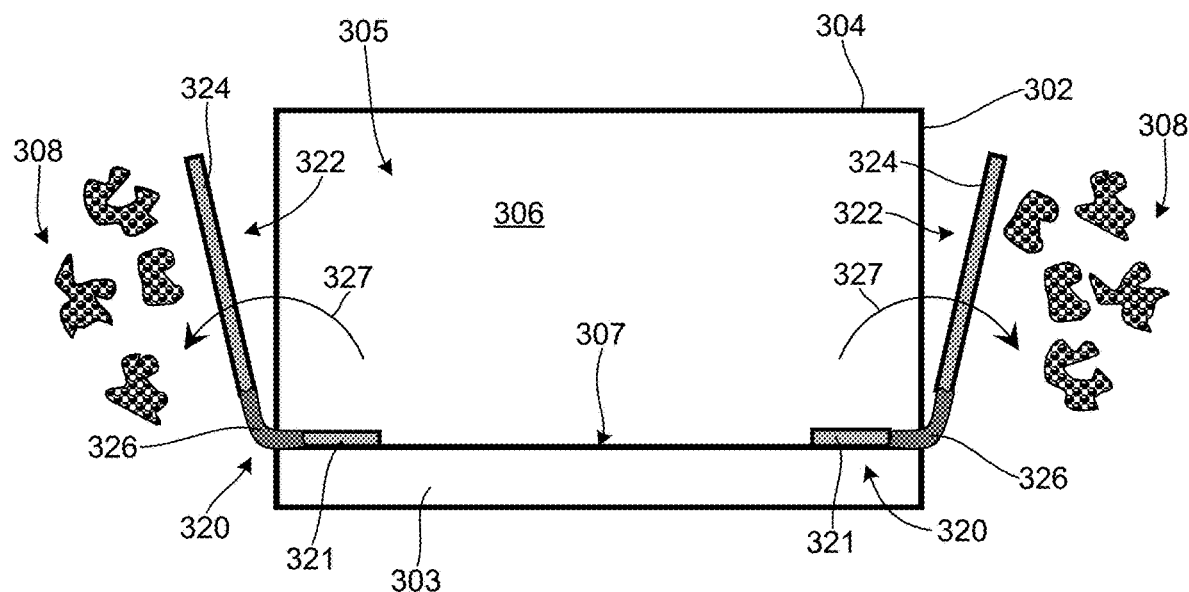
FIG. 8B is a side elevation view of the cleaning elements shown in FIG. 6 in a cleaning configuration in accordance with the present technology.

FIGS. 8A and 8B show side elevation views of the cleaning elements 320 performing a cleaning cycle by moving from the flow configuration (FIG. 8A) to the cleaning configuration (FIG. 8B). When the cleaning elements 320 are in the flow configuration (FIG. 8A), the flex portions 326 form a generally C-shaped bend such the capture portions 324 can be at least substantially parallel to the floor portions 307 (e.g., horizontal in the orientation of FIG. 8A). In this configuration, contaminants 308 can accumulate on the capture portions 324 instead of the floor portions 307. Referring to FIG. 8B, when the cleaning elements 320 move to the cleaning configuration (arrows 327), the flex portions 326 can change shape (e.g., at least partially straighten to a bend with a right-angle or other angle), causing the capture portions 324 to rotate out of the channel 305 and thereby remove the contaminants 308 from the channel 305.

In the previously described embodiments, the cleaning elements are formed from a shape-memory alloy having a two-way shape-memory effect. In some embodiments, the entire cleaning elements are formed from the shape-memory alloy. In other embodiments, only the flex portions are formed from the shape-memory alloy while the bases and the capture portions are formed from a different material, such as aluminum. In still other embodiments, the cleaning elements may not include a shape-memory alloy. Instead, the cleaning elements or only the flex portions can be formed from a bimetallic strip. Bimetallic strips include two strips of different metals joined together, where the two different metals have different coefficients of thermal expansion. The two different strips can be joined together with riveting, brazing, or welding. When a bimetallic strip is heated, the different metals expand at different rates and causes the strip to bend. After the strip cools down, the strip can return to its original shape. Accordingly, forming the flex portions of the cleaning elements from a bimetallic strip can allow the flex portions to change shape as the temperature of the cleaning elements changes. In general, the bimetallic strip will bend away from the metal having the higher coefficient of thermal expansion as the temperature increases because this metal expands more than the other metal. In some embodiments, the cleaning elements can be configured such that the metal having the higher coefficient of thermal expansion faces away from channels of the heatsink. In this way, as the temperature increases, the arms of the cleaning elements bend into the channels as the outside metal expands more than the inside metal. Conversely, when the cleaning elements cool, the arms can bend out of the channels to complete a cleaning cycle.

In the previously described embodiments, the cleaning elements are configured to automatically move between the flow configuration and the cleaning configuration based on the temperature of the cleaning elements. With this arrangement, the cleaning elements can operate without additional sensors or wires. Further, the cleaning elements can be incorporated into existing electronic devices by installing new heatsinks. However, these cleaning elements are limited to performing cleaning cycles when the temperature crosses certain threshold temperatures. To allow the cleaning elements to perform a cleaning cycle at any selected time, some embodiments of the cleaning elements can include an electromagnetic actuator that causes the arms to move between the flow configuration and the cleaning configuration.

Figure 9A:
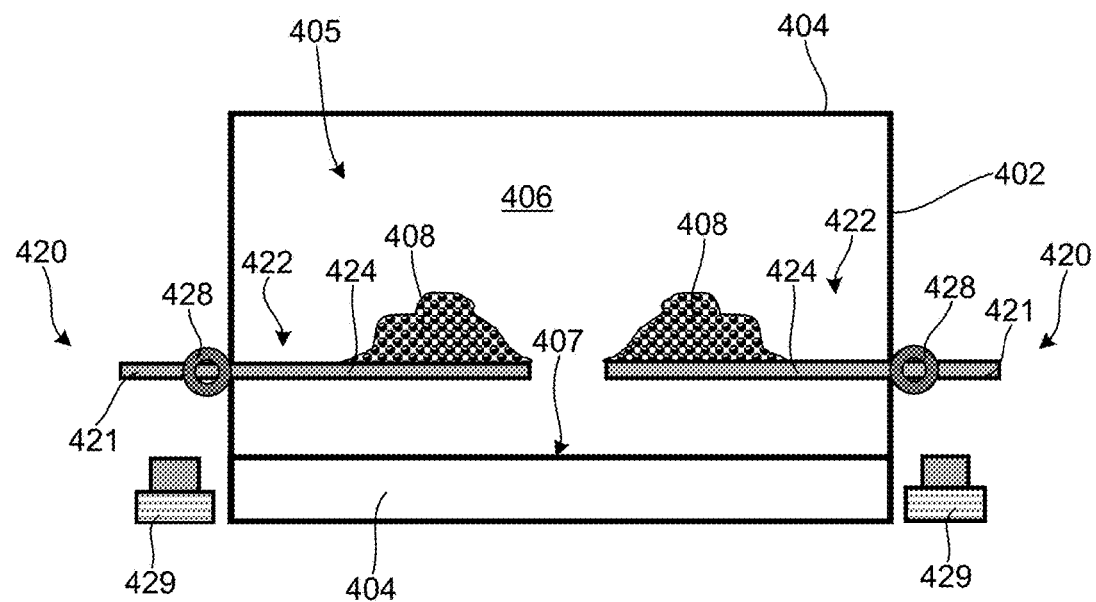
FIG. 9A is a side elevation view of cleaning elements in an flow configuration in accordance with the present technology.
Figure 9B:
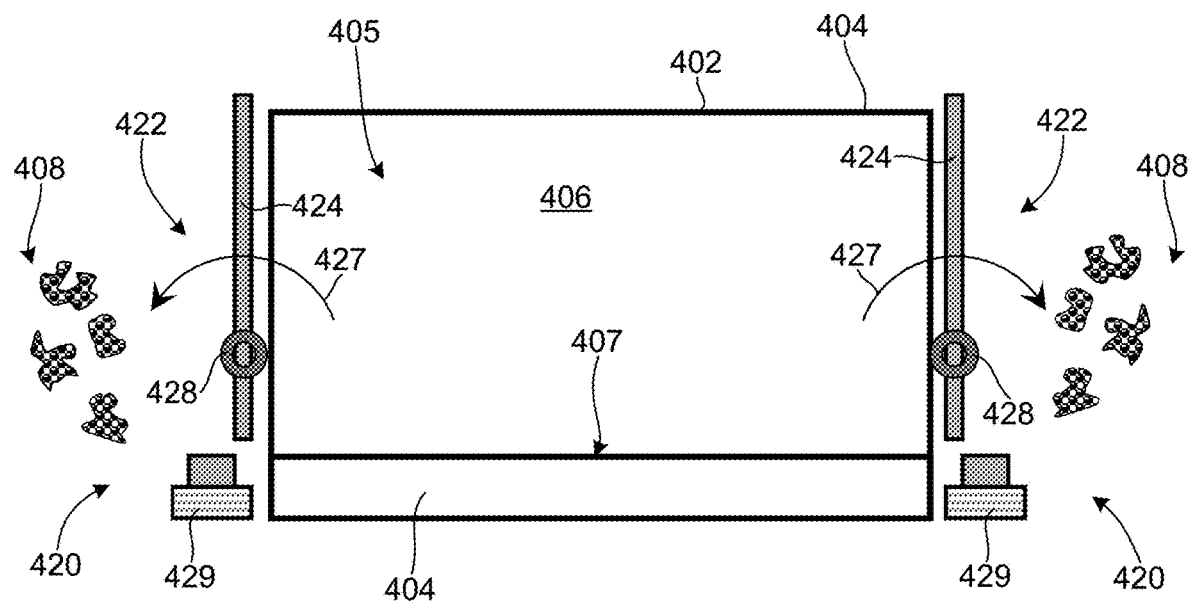
FIG. 9B is a side elevation view of the cleaning elements shown in FIG. 9A in a cleaning configuration in accordance with the present technology.

FIGS. 9A and 9B are side elevation views of a heatsink 402 and two cleaning elements 420 in a flow configuration (FIG. 9A) and a cleaning configuration (FIG. 9B). The cleaning elements 420 include a base 421, arms 422, a pivot point 428 between the arms 422 and the base 421, and an actuator 429. The arms 422 can have a comb-like arrangement and extend from the base 421 similar to the cleaning element 220 described above with reference to FIGS. 3 and 4. Each arm 422 can have a capture portion 424. The cleaning elements 420 are positioned adjacent to the ends of the heatsink 402 such that the arms 422 are aligned with corresponding channels 405 of the heatsink 402. The base 421 can be formed from a ferromagnetic material and the actuator 429 can include an electromagnet that can be selectively activated. When the cleaning elements 420 are in the flow configuration (FIG. 9A), the arms 422 can extend into the channels 405. In this way, contaminants 408 can accumulate on the arms 422 instead of on floor portions 407 of the channels 405. In this configuration, the actuator 429 can be deactivated (i.e., no current is applied).

To move the cleaning elements 420 to the cleaning configuration (FIG. 9B), the actuator 429 can be activated such that it produces a magnetic field that attracts the ferromagnetic base 421. As the base 421 moves, the arms 422 rotate outwardly about the pivot point 428 (arrows 427) and move out of the channels 405 to remove the contaminants 408 from the channels 405. The cleaning elements 420 can be moved back to the flow configuration by reversing the magnetic field generated by the actuators 429 so that the bases 421 are pushed away from the actuators. Alternatively, the cleaning elements 420 can be moved back to the flow configuration by deactivating the actuators 420 and allowing gravity or a spring to rotate the arms 422 into the channels 405. With this configuration, the cleaning elements 420 can perform a cleaning cycle when desired without the temperature crossing a specific threshold temperature. Further, the strength of the magnetic field generated by the actuators 429 can be changed to adjust the force exerted by the arms 422 on the accumulated contaminants 408, which can help to remove larger accumulations.

In the previously described embodiments, the heatsink is described as including a plurality of fins that extend away from a base and that are generally parallel to each other. In other embodiments, the heatsink includes a plurality of needles that extend away from the main body portion. The needles are arranged in a 2-dimensional array and the cleaning elements can be arranged along the edges of the array such that the arms of the cleaning elements pass between adjacent rows and/or columns of the needles.

Figure 10:
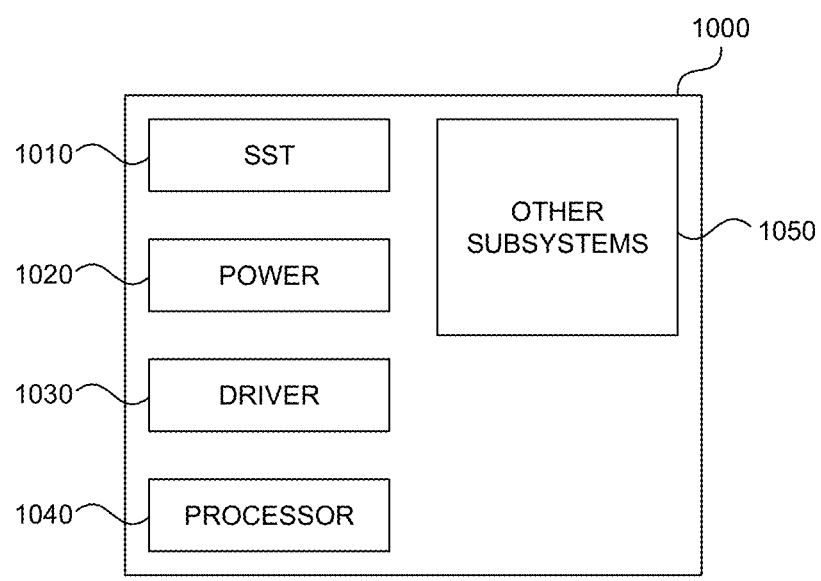
FIG. 10 is a schematic diagram of a system incorporating a semiconductor device assembly in accordance with the present technology.

Any of the cleaning elements described above with reference to FIGS. 3-9B can be incorporated into any of a myriad of larger and/or more complex systems, a representative example of which is system 1000 shown schematically in FIG. 10. The system 1000 can include an SST device 1010, a power supply 1020, a driver 1030, a processor 1040, and/or other subsystems or components 1050. As discussed above, the SST device 1010 can heat up and can include one or more heatsinks configured to remove heat from the SST device 1010 to provide cooling. Additionally, the power supply 1020, the driver 1030, the processor 1040, and/or other subsystems or components 1050 can include also include one more heatsinks. Accordingly, representative systems 1000 can include, without limitation, hand-held devices (e.g., cellular or mobile phones, tablets, digital readers, and digital audio players), lasers, photovoltaic cells, remote controls, computers, and appliances (e.g., refrigerators). Components of the system 1000 may be housed in a single unit or distributed over multiple, interconnected units (e.g., through a communications network). The components of the system 1000 can also include local and/or remote memory storage devices, and any of a wide variety of computer-readable media.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as being inverted.

From the foregoing, it will be appreciated that specific embodiments of the technology have been described herein for purposes of illustration, but that various modifications may be made without deviating from the disclosure. For example, the cleaning elements 220 and 420 shown in FIGS. 3-5B, 9A, and 9B include five arms 222, 422 coupled to bases 221, 421. However, in other embodiments, cleaning elements 220, 420 can include one, two, three, four, or more than five arms 222, 422 coupled to bases 221, 421, respectively. Certain aspects of the new technology described in the context of particular embodiments may be combined or eliminated in other embodiments. For example, the actuators 429 shown in FIGS. 9A and 9B can be used in conjunction with the cleaning elements 320 shown in FIGS. 6-8B. Additionally, while advantages associated with certain embodiments of the new technology have been described in the context of those embodiments, other embodiments may also exhibit such advantages but not all embodiments necessarily need to exhibit such advantages to fall within the scope of the technology. Accordingly, the disclosure and

The invention claimed is:

1. A system for cooling semiconductor devices, comprising:
   a heatsink having a top surface and fins projecting out from the top surface, the fins spaced apart from each other by channels, wherein the top surface defines a floor portion between each pair of adjacent fins; and
   a cleaning element having bases and arms extending from the bases, the cleaning element being positioned with respect to the heatsink such that each arm is aligned with a corresponding channel between the fins, wherein the arms are moveable between a flow configuration in which the arms are in the channels and a cleaning configuration in which the arms are outside of the channels, and wherein the bases are coupled to corresponding floor portions on opposing ends of the channel.

2. The system of claim 1 wherein:
   each arm includes a flex portion extending from the base and a capture portion extending from the flex portion;
   when the apparatus is in the flow configuration, the capture portion of each arm is positioned within the channels, and
   when the apparatus is in the cleaning configuration, the capture portions of each arm is outside of the channels, wherein the flex portion comprises a two-way shape-memory material configured to be curved in the flow configuration at desired operating temperatures and to be at least substantially straight in the cleaning configuration at a selected threshold temperature above the desired operating temperatures.

3. The system of claim 2 wherein:
   the heatsink has a panel and the fins project from the panel;
   when the cleaning element is in the flow configuration, the arms are at least substantially parallel to the panel such that contaminants can accumulate on the arms; and
   when the cleaning element is in the cleaning configuration, the arms are at least 90° from the position in the flow configuration.

4. The system of claim 1 wherein, when the cleaning element is in the flow configuration, the arms extend laterally through the channels.

5. The system of claim 1 wherein:
   each arm includes a capture portion and a flex portion, and the capture portion extends from the flex portion;
   the flex portions have a curved configuration when the apparatus is in the flow configuration; and
   the flex portions are at least partially straightened relative to the curved configuration when the apparatus is in the cleaning configuration.

6. The system of claim 1 wherein the arms comprise a shape-memory material having a threshold temperature and wherein the arms are configured to move from the flow configuration to the cleaning configuration when the temperature of the apparatus crosses the threshold temperature.

7. The system of claim 6, wherein:
   the cleaning element is configured to move from the cleaning configuration to the flow configuration when the temperature of the cleaning element crosses from below the threshold temperature to above the threshold temperature; and
   the cleaning element is configured to move from the flow configuration to the cleaning configuration when the temperature of the cleaning element crosses from above the threshold temperature to below the threshold temperature.

8. The system of claim 1 wherein each of the arms comprises a bimetallic strip configured to change shape as the temperature of the cleaning element changes and wherein the cleaning element is configured to move between the flow configuration and the cleaning configuration as the bimetallic strips change shape.

9. The system of claim 1 wherein:
   the cleaning element comprises a first cleaning element at one end of the heatsink; and
   the system further comprises a second cleaning element at an opposing end of the heatsink, and the second cleaning element comprises a base and arms extending from the base, the second cleaning element being positioned with respect to the heatsink such that each arm of the second cleaning element is aligned with a corresponding channel of the heatsink, and the arms of the second cleaning element are moveable between a flow configuration in which the arms extend into the channels from the opposing end of the heatsink and a cleaning configuration in which the arms are outside of the channels.

10. The system of claim 9 wherein each arm has a flex portion extending from the base and a capture portion extending from the flex portion, and the flex portion having a bend in the flow configuration and the flex portion being straighter in the cleaning configuration such that the arms rotate out of the channels from the flow configuration to the cleaning configuration.

11. A semiconductor device assembly, comprising:
    a semiconductor device having an integrated circuit;
    a heatsink having a panel thermally coupled the semiconductor device and fins projecting from the panel, wherein the fins are spaced apart from each other by channels, and wherein each channel has a floor portion; and
    at least a first cleaning element at one end of the heatsink, the first cleaning element comprising a base and at least one arm aligned with one of the channels, and the arm having a flex portion extending from the base and a capture portion extending from the flex portion, wherein the flex portion has a bend in a flow configuration such that the capture portion extends in the one channel over the floor portion and the flex portion at least partially straightens relative to the bend to a cleaning configuration in which the arm is outside the channel, and wherein the base is coupled to the floor portion,
    wherein:
       the first cleaning element has a plurality of arms attached to the base, and each arm has a flex portion extending from the base and a capture portion extending from the flex portion;
       the first cleaning element is at one end of the heatsink such that the arms of the first cleaning element are aligned with corresponding channels of the heatsink;
       the assembly further comprises a second cleaning element comprising a base and a plurality of arms extending from the base, each arm of the second cleaning element has a flex portion extending from the base and a capture portion extending from the flex portion, and the flex portion has a bend in a flow configuration and the flex portion at least partially straightens relative to the bend to a cleaning configuration in which the arm rotates outwardly; and the second cleaning element is at an opposing end of the heatsink such that the arms of the second cleaning element are aligned with corresponding channels of the heatsink.

12. The semiconductor device assembly of claim 11 wherein at least the flex portions of the arms of the first and second cleaning elements comprise a shape-memory material.

13. The semiconductor device assembly of claim 11 wherein at least the flex portions of the arms of the first and second cleaning elements comprise a bimetallic strip.

* * * * *